(12) United States Patent
Martin et al.

(10) Patent No.: US 11,698,661 B2
(45) Date of Patent: Jul. 11, 2023

(54) TACTICAL ASSAULT KIT BOX

(71) Applicant: Government of the United States as represented by the Secretary of the Air Force, Wright-Patterson AFB, OH (US)

(72) Inventors: Shea T Martin, Dayton, OH (US); Peter J Voland, Beavercreek, OH (US); Patrick E Assef, Dayton, OH (US)

(73) Assignee: United States of America as represented by the Secretary of the Air Force, Wright-Patterson AFB, OH (US)

(*) Notice: Subject to any disclaimer, the term of this patent is extended or adjusted under 35 U.S.C. 154(b) by 283 days.

(21) Appl. No.: 17/025,250

(22) Filed: Sep. 18, 2020

(65) Prior Publication Data

US 2022/0091634 A1    Mar. 24, 2022

(51) Int. Cl.
| | | |
|---|---|---|
| *G06F 1/16* | (2006.01) | |
| *H05K 5/00* | (2006.01) | |
| *H05K 5/03* | (2006.01) | |
| *A45C 5/00* | (2006.01) | |
| *A45C 13/02* | (2006.01) | |
| *A45C 15/00* | (2006.01) | |

(52) U.S. Cl.
CPC ............. *G06F 1/1628* (2013.01); *A45C 5/00* (2013.01); *A45C 13/02* (2013.01); *A45C 15/00* (2013.01); *H05K 5/0017* (2013.01); *H05K 5/03* (2013.01); *A45C 2013/026* (2013.01)

(58) Field of Classification Search
None
See application file for complete search history.

(56) References Cited

U.S. PATENT DOCUMENTS

| | | | |
|---|---|---|---|
| 9,973,229 B2 | 5/2018 | Rana | |
| 2010/0246119 A1* | 9/2010 | Collopy | G06F 1/1684 |
| | | | 361/679.55 |

* cited by examiner

*Primary Examiner* — Jerry Wu
(74) *Attorney, Agent, or Firm* — AFMCLO/JAZ; Chastity D. S. Whitaker (57) ABSTRACT

A field-operable tactical operations management system. The system includes a case and a field interface within the case. The case has a rigid base and a rigid lid that is pivotally coupled to the rigid base. The field interface includes a power management system, a plurality of compartments, a user input device, and a display. The power management system stores energy, powers the field interface, or both. Each of the plurality of compartments receives a peripheral device. The display is operably coupled to the rigid lid of the case. The field interface is configured to be operably coupled to an end user device, which enables the end user device to be operated by way of the field interface with the user input device.

13 Claims, 6 Drawing Sheets

TACTICAL ASSAULT KIT BOX

RIGHTS OF THE GOVERNMENT

The invention described herein may be manufactured and used by or for the Government of the United States for all governmental purposes without the payment of any royalty.

FIELD OF THE INVENTION

The present invention relates generally to devices and methods of planning military missions.

BACKGROUND OF THE INVENTION

The planning of military missions takes significant time and resources and is typically accomplished within a Tactical Operations Center ("TOC"), an Air and Space Operations Center ("ASOC"), or a squadron using software (such as FalconView). Once a plan is complete, details of the plan must be manually transferred to a dismounted system, such as an EUD (End User Device, such as a smart phone, a tablet, a laptop, and so forth), an OCS (Operational Control System) kit, a SWAK (Special Warfare Assault Kit), or an ATAK (Android Team Awareness Kit). This transfer must be manual as there is presently no method or interface by which digital data transfer may occur. In other words, all plotting routes, targets, points, restricted operating zone ("ROZ"), 9 lines (required briefing standards), AO (Area of Operations) update briefs, imagery, and so forth are manually input into the dismounted system.

The manual data transfer is further complicated by the fact that the display screens of most dismounted systems is typically small and the display is limited to a singular interface at a time. While some solutions are available, such as WINTAK (Windows Tactical Assault Kit), these capabilities are not widely fielded, have not passed certifications for complete implementation, or both. Moreover, these proposed solutions still lack an ability to interface with existing planning capabilities.

As a result, there remains a need for systems and methods that enable mission planning and tactical operations center work using an end user device.

SUMMARY OF THE INVENTION

The present invention overcomes the foregoing problems and other shortcomings, drawbacks, and challenges of utilizing mission planning and tactical operations center work in the field with a dismounted system, such as an end user device. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention a field-operable tactical operations management system includes a case and a field interface within the case. The case has a rigid base and a rigid lid that is pivotally coupled to the rigid base. The field interface includes a power management system, a plurality of compartments, a user input device, and a display. The power management system stores energy, powers the field interface, or both. Each of the plurality of compartments receives a peripheral device. The display is operably coupled to the rigid lid of the case. The field interface is configured to be operably coupled to an end user device, which enables the end user device to be operated by way of the field interface with the user input device.

In accordance with another embodiment of the present invention a field-operable tactical operations management supersystem includes a case, a field interface, and a computing system. The case has a rigid base and a rigid lid that is pivotally coupled to the rigid base. The field interface includes a power management system, a plurality of compartments, a user input device, and a display. The power management system stores energy, powers the field interface, or both. Each of the plurality of compartments receives a peripheral device. The display is operably coupled to the rigid lid of the case. The computing system is configured to interface with the field interface, which enables the computing system to be operated by way of the field interface with the user input device Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1:
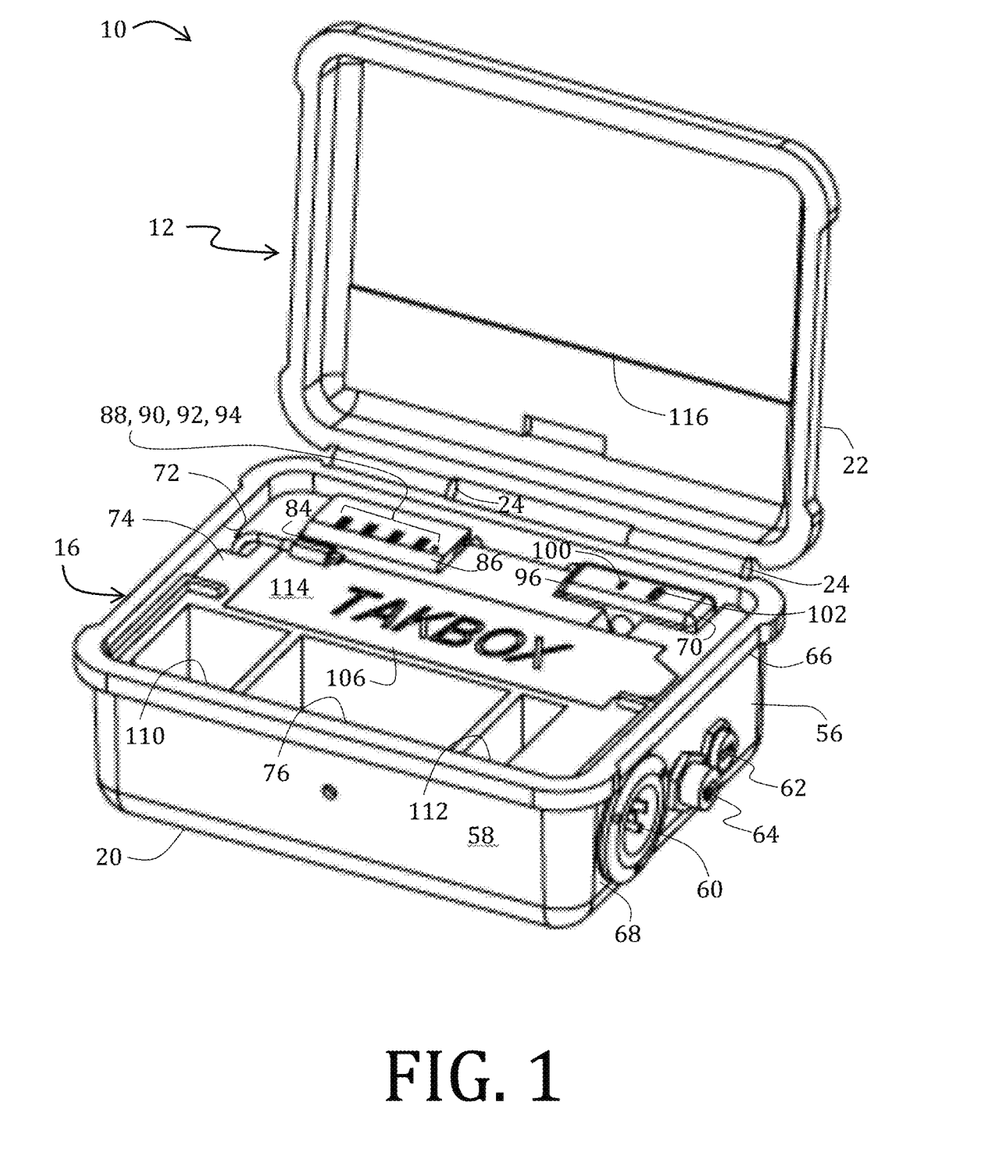
FIG. 1 is a perspective of a tactical assault system according to an embodiment of the present invention.
Figure 2:
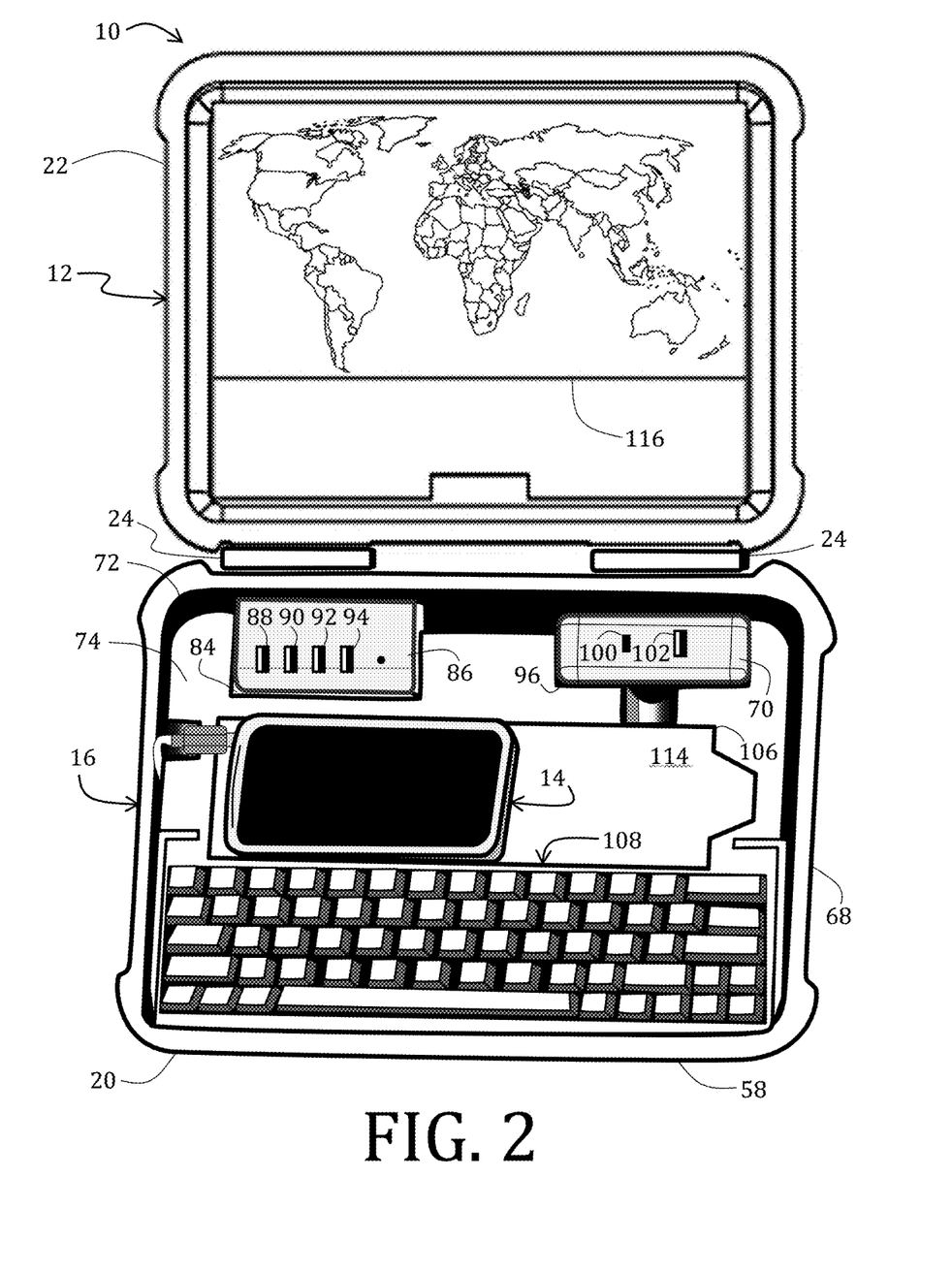
FIG. 2 is a top view of the tactical assault system of FIG. 1 having a lid of the case fully open.

Referring now to the figures, and in particular to FIGS. 1 and 2, a tactical assault system 10 according to an embodiment of the present invention is shown. The system 10 includes a field interface 12 configured to be operably coupled to a dismounted system or other computing system, but for purposes of illustration includes an end user device 14 ("EUD"). The field interface 12 may be secured within a case 16, which may be waterproof, water resistant, or watertight. The case 16, for some particular embodiments, may also be crushproof, dust proof, include a locking mechanism to secure the contents therein, or combinations thereof. One commercially available case that may be suitable for some embodiments is a PELICAN 1400 Protector Case. Such exemplary case 16 comprises a base 20 operably coupled to a lid 22, such as by rotatable hinges 24.

The case construction materials may include plastics, aluminum, composites, fiber-reinforced materials, carbon fibers, silicon, and so forth. For some embodiments it may be advantageous to incorporate other materials suitable for a particular use, such as EMI shielding, water resistance, heat resistant, cold resistant, and so forth.

The case 16 of some embodiments of the system 10 may include docking ports (not shown) or brackets that are configured to mount the system 10 to a vehicular interface (such as to a radio mount/rack system, the Mobile Communications System ("MCS"), or other like systems).

The field interface 12 is configured to be operated by the EUD 14. Such dismounted systems may include Android-based or those manufactured by APPLE. The details of the computing system 26 conventional to such dismounted systems are described with reference to FIG. 3. The computing system 26 will be referred to as "computer" for brevity's sake, although it should be appreciated that the term "computing system" may also include other suitable programmable electronic devices consistent with embodiments of the invention.

Figure 3:
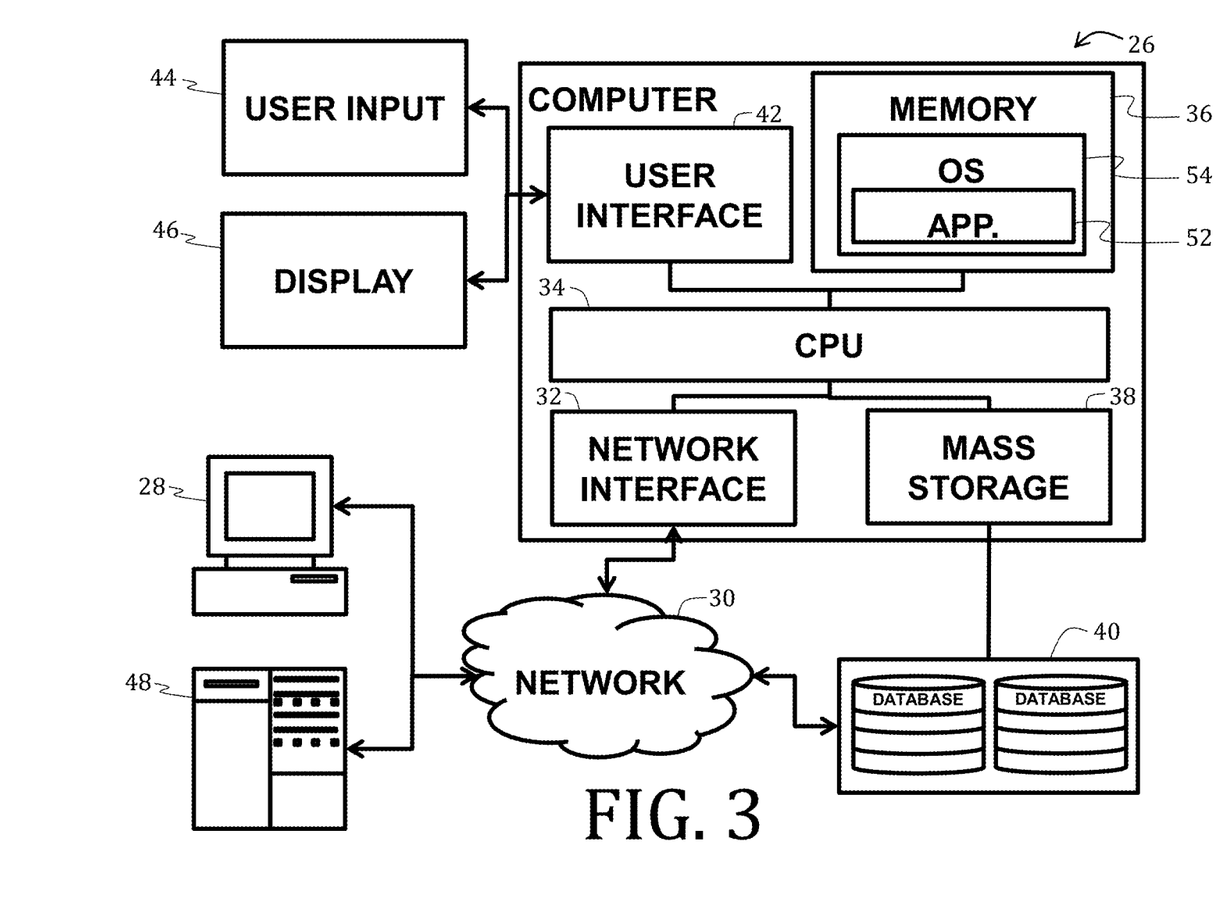
FIG. 3 is a schematic diagram of a computing system according to an embodiment of the present invention.
Figure 4:
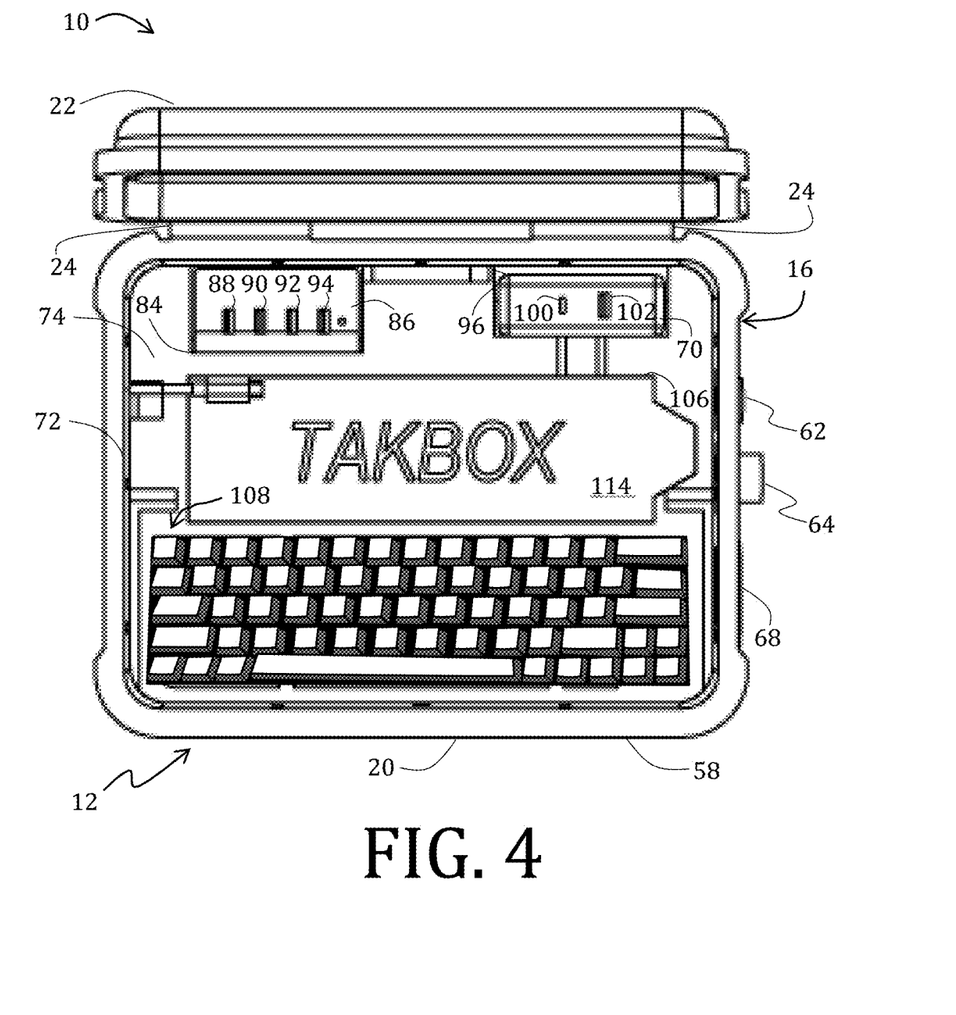
FIG. 4 is a top view of the tactical assault system of FIG. 1 with the lid in a user-friendly position.

The computing system 26 may be implemented with one or more networked computers 28 using one or more networks 30, e.g., in a cluster or other distributed computing system through a network interface 32 (illustrated as "NETWORK I/F").

The computing system 26 typically includes at least one processing unit 34 (illustrated as "CPU") coupled to a memory 36 along with several different types of peripheral devices, e.g., a mass storage device 38 with one or more databases 40, an input/output interface 42 (illustrated as "I/O I/F") coupled to a user input 44 and a display 46, and the Network I/F 32. The memory 36 may include dynamic random access memory ("DRAM"), static random access memory ("SRAM"), non-volatile random access memory ("NVRAM"), persistent memory, flash memory, at least one hard disk drive, and/or another digital storage medium. The mass storage device 38 is typically at least one hard disk drive and may be located externally to the computing system 26, such as in a separate enclosure or in one or more networked computers 28, one or more networked storage devices (including, for example, a tape or optical drive), and/or one or more other networked devices (including, for example, a server 48).

The CPU 34 may be, in various embodiments, a single-thread, multi-threaded, multi-core, and/or multi-element processing unit (not shown) as is well known in the art. In alternative embodiments, the computing system 26 may include a plurality of processing units that may include single-thread processing units, multi-threaded processing units, multi-core processing units, multi-element processing units, and/or combinations thereof as is well known in the art. Similarly, the memory 36 may include one or more levels of data, instruction, and/or combination caches, with caches serving the individual processing unit or multiple processing units (not shown) as is well known in the art.

The memory 36 of the computing system 26 may include one or more applications 52 (illustrated as "APP"), or other software program, which are configured to execute in combination with an Operating System 54 (illustrated as "OS") and automatically perform tasks, with or without accessing further information or data from the database(s) 40 of the mass storage device 38.

Altogether, the tactical assault system with the computing system may comprise a supersystem configured to enable mission planning and tactical operations center work using an end user device.

Referring again to FIGS. 1 and 2, the computing system 26/EUD 14 may be configured to be operably coupled to the field interface 12 while positioned within the case 16; however, it is possible according to other embodiments that the EUD 14 may remain external to the case 16. Connection between the field interface 12 and the EUD 14 may be wired or wireless. Wireless capability may be functionally built into the system or operably incorporated through a USB hub for transmission via WIFI, BLUETOOTH, or other similar methods. For some embodiments, particularly those related to mission planning, wired connections may be preferred so as to reduce or eliminate electromagnetic interference ("EMI") risk.

Referring now to FIG. 1, an interface panel 56 may be provided on an external surface 58 of the case 16 and may include a power adapter 60, data ports 62 (such as USB), network and protocol ports 64 (such as Ethernet), or other audiovisual data ports (such as such as an HDMI connector such that the video output may be projected onto a TV or a projector) as needed or desired.

The panel 56 may be fabricated from waterproof materials (e.g., plastics, resins, polymers, corrosion resistant metals, or metals coated with layer protective sealant) and installed into a slot 66 cut into a side 68 of the case 16. Electrical connections for the panel 56 may break out to surface pads and connect to accessory cables that break out to mating connectors with spring pins. The breakouts may be coupled to the case 16 using magnets built into the panel 56 and the cable ends. A sealant may be used to maintain the water-resistance of the case 16 proximate to the panel 56.

The power adapter 60 of the panel 56 may be operably coupled to a power management system (not specifically illustrated; however, a power supply panel 70 that is operably coupled to the power management system is shown), such as an Uninterruptible Power Supply ("UPS"), that is secured within the case 16. A power cable (not shown) with a magnetic connection completes the connection to AC power sources (different cables may exist that terminate to different AC plug types). In this way, the system 10 may operate on an external power supply, such as a 110-240 volt AC wall outlet power. Alternatively or additionally, the system 10 may include a DC battery backup configured to operate for over an hour when fully charged. According to some embodiments, an integrated power switch (not shown) may be accessible from the external surface 58 of the case 16, such as at the panel 56, so as to control power for all accessories and to reduce a chance of draining the power management system (not shown) when the system 10 is not in use.

For some embodiments, the system 10 may alternatively be configured to operate on DC power. As such, power may be sourced from an automobile cigarette lighter, military battery connectors, or other such alternative power supplies.

Optionally, and although not specifically illustrated herein, caps or seals may be configured to be received by the adapters 60 or ports 62, 64 of the panel 56 when the system 10 is not in use. Alternatively, a cap or seal may be operably configured to be received by the panel 56, itself, when the system 10 is not in use.

With reference now to FIGS. 1, 2, and 4-6, and according to the illustrated embodiment, an interior 72 of the base 20 of the case 16 may include an insert 74 such that the interior 72 may be compartmentalized. A plurality of compartments, channels, and other organization structures may be formed such that each compartment of the plurality is configured to receive a particular peripheral device. For example, a first compartment 76 may be configured to receive a computer mouse 78, a second compartment 80 may be configured to stow power cables 82, a third compartment 84 may be configured to receive a data hub 86 having a plurality of USB ports 88, 90, 92, 94, and a fourth compartment 96 may be configured to receive the power supply panel 70 (such as a USB to HDMI and Ethernet splitter), having a USB PD 100 and a USB port 102, for example, for providing power to peripheral devices. Of course those having ordinary skill in the art having the benefit of the disclosure made herein would readily appreciate that any number and shape of compartments may be used according to preference or need.

Walls of the insert 74 defining the plurality of compartments 76, 80, 84, 96 may be constructed from by additive manufacturing, molded, extruded, formed out of foam (such as PICK N PLUCK or other charcoal regular foam materials), or other known methods. The walls may be secured to the interior 72 of the base 72, to one another, or both by pressure or friction fit, adhesives, fasteners (rivets, screws, nails, and so forth), or a combination thereof.

For still other embodiments, walls of the insert 74 may be modular such that a shape, size, number, or combination thereof for the plurality of compartment 76, 80, 84, 96 may be arranged as needed.

Figure 5:
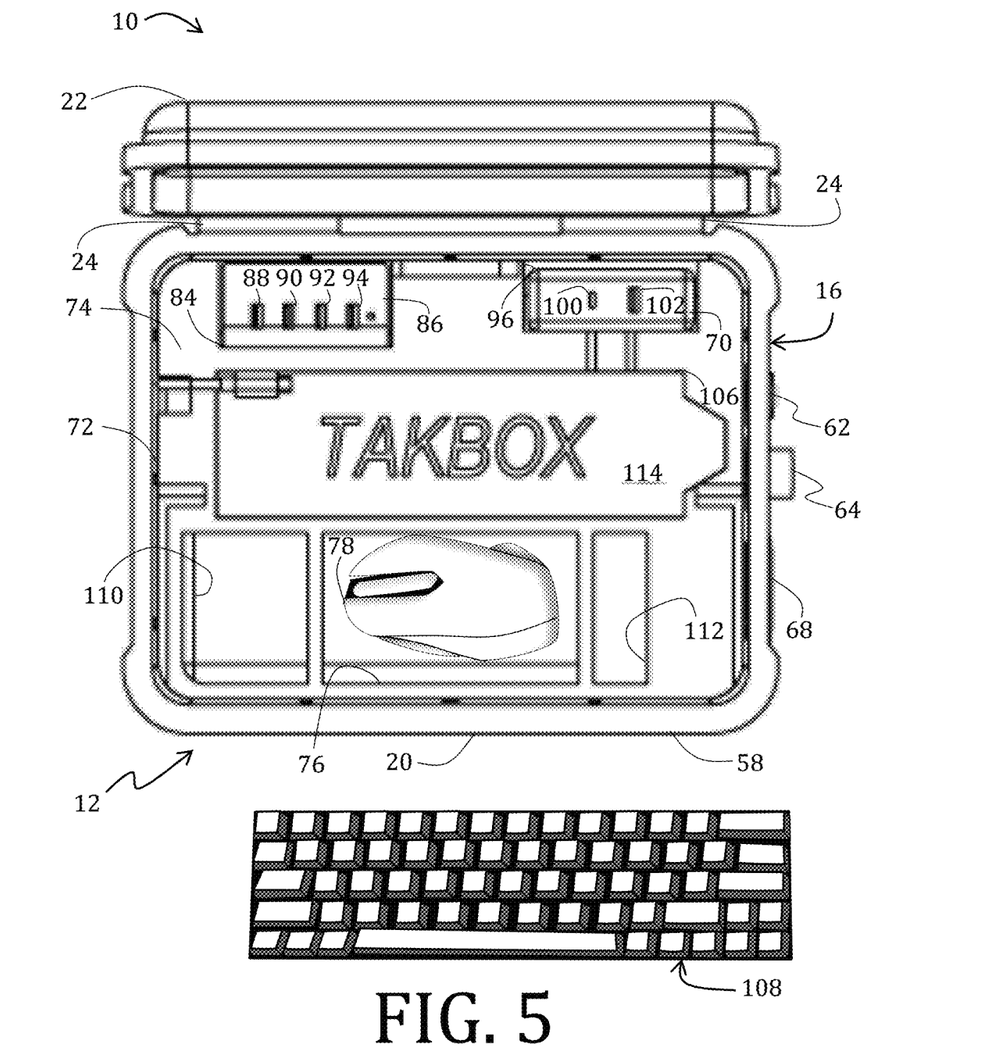
FIG. 5 is a top view of the tactical assault system of FIG. 4 with a keyboard removed to reveal compartments.
Figure 6:
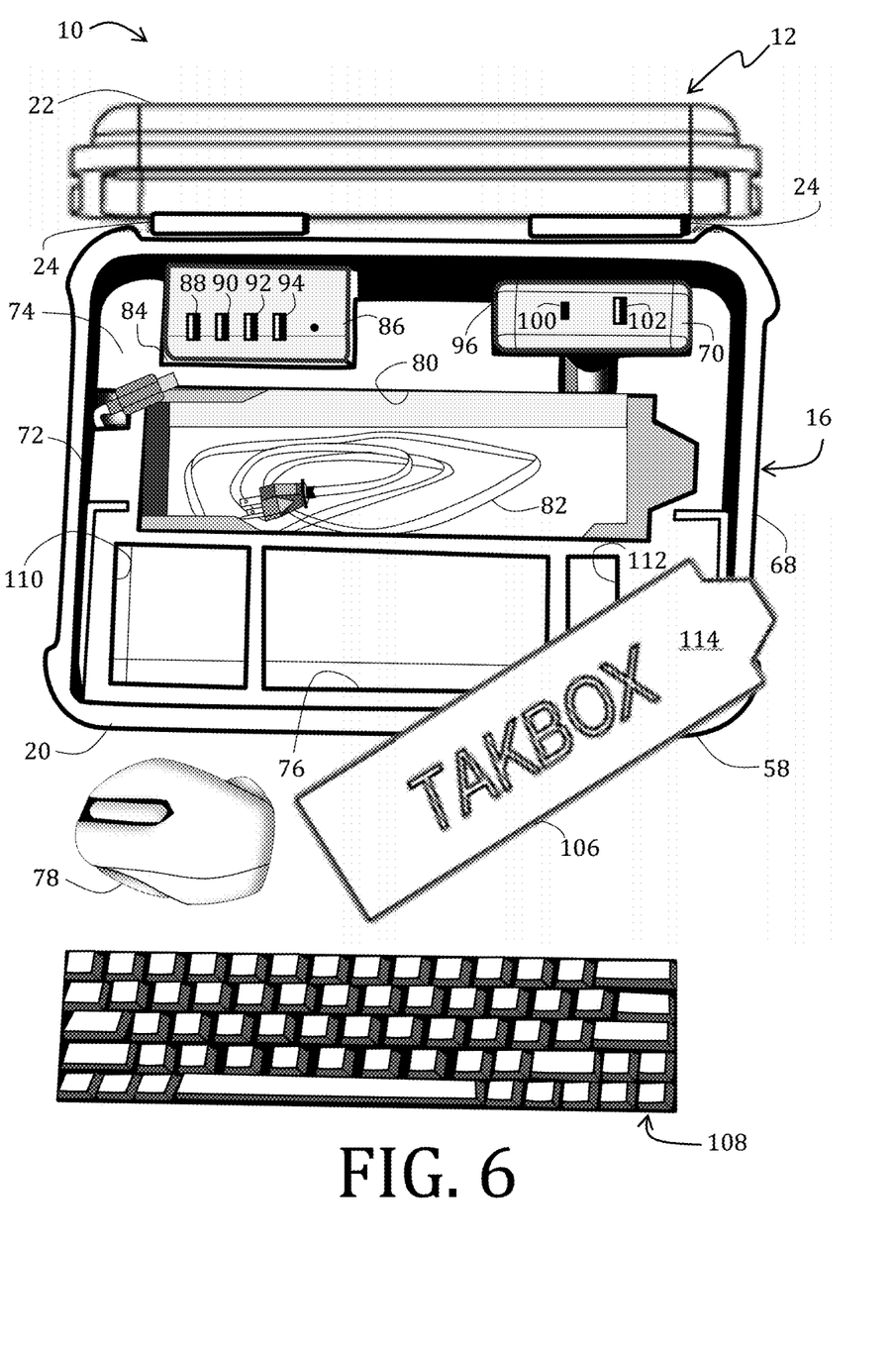
FIG. 6 is a top view of the tactical assault system of FIG. 5 with a cover removed to reveal additional compartments.

According to some embodiments, one or more compartments 76, 80, 84, 96 may be configured to receive a cover 106 so as to secure peripheral components therein. As specifically shown in FIGS. 5 and 6, the illustrative cover 106 is received by the second compartment 80. According to other embodiments, the cover may comprise a peripheral component, such as a keyboard 108. FIGS. 5 and 6 also illustrate this use of the keyboard 108 operating to cover the first compartment 76 (as well as fifth and sixth compartments 110, 112 having no accessory stored therein). For some embodiments, the cover 106 may constructed from or include a magnetic material such that the EUD 14 may be secured to the field interface 12 when the system 10 is operational. Alternative mechanisms for retaining the EUD 14 and other peripherals in place may include tabs, snap fit, latches, and so on. In other embodiments, a surface 114 of the cover 106 may be texturized (such as with groves, although not shown) or include high friction materials for providing slip resistance. For example, the texturized cover may be used to secure the keyboard 108 in place during use.

Referring now to FIGS. 1, 2, and 4-6, the data hub 86, in addition or alternative to the data port 62 of the panel 56, may be used to operably couple the field interface 12 to the mass storage device 38 (FIG. 3) having relevant imagery stored in the memory 36 (FIG. 3) thereof. For instance, external databases 40 (FIG. 3) or other external memory drives having relevant imagery saved thereon may be connected directly to the EUD 14 through the data hub 86 such that imagery may easily be loaded onto the EUD 14. Conventionally such imagery transfer required users to remove the EUD 14 from its protective case (not shown), remove an SD card (not shown) from the EUD 14, and then insert another SD card with the relevant imagery. This time-intensive process is made significantly easier by the quick plug-and-play capability, leading to a drastic decrease in time and effort required to load imagery onto multiple EUDs 14.

Moreover, it is envisioned that some embodiments of the present invention may be operably coupled to a plurality of EUDs. For example, a first EUD may be operably coupled to the system 10 for transferring imagery, a second EUD may be operably coupled to the system 10 for transferring mission plans, and so on.

The data hub 86 may also be used in mission debriefings to gather data from the field interface 12, particularly its peripheral devices (recorders, speakers, microphones, and so forth) and consolidate it directly on the EUD 14.

The data hub 86 may also be configured to enable the user to operably connect to networked computers or systems, such as a fielded OCS (operational control system) kit. OCS kits connect all the peripheral radios and GPS devices that enable tactical dada link communications (e.g., variable message format, link 16, SADL, NETT, and MANET). Such capability enables the user to maintain all required connectivity to these peripheral radios and other devices.

Referring still to FIGS. 1, 2, and 4-6, the lid 22 of the case 16 may be configured to receive the user display 46 (FIG. 3), which may be, as specifically illustrated, a computer monitor 116. One particular commercially, available monitor may be a 12 volt, LCD screen. Additional user displays 46 (FIG. 3) may be operably coupled to the system 10 for providing expanded views or additional views.

Hinges 24 of the lid 22 may include stays or other position locks that are operable to keep the case 16 open or to lock the lid 22 at a particular angle with respect to the base 20 of the case 16.

Referring now to all figures, and in use, the user may open the case 16 and remove any required or preferred peripheral devices. If there is a power source available, the user may connect the field interface 12 into the power source by way of the power adapter 60. If needed or desired, the user may utilize the data port 62 of the panel 56 or the data hub 86 to operably connect the field interface 12 to one or more peripheral devices. If a network 32 (FIG. 3) is available, the user may operably connect the field interface 12 to the network 32 (FIG. 3) wirelessly or via the network port 64 of the panel 56.

According to some embodiments, the field interface 12 may also be operably connected to a secure network. Conventionally, the EUD 14 is unable to connect to secure networks for direct file transfer because the EUD 14 cannot be imaged as a stand-alone computing device. The field interface 12 may, therefore, include an imaged modem interface between the EUD 14 and the secure network to permit direct file transfer. Such capability could provide enhanced connectivity between the tactical assault system 10 and other assets in an operational environment.

With all connections made, the user may then flip the switch (not shown) to power up the field interface 12 and the peripheral devices. The field interface 12 may then be operably coupled to the EUD 14, such as through an integrated desktop experience (such as SAMSUNG "Desktop eXperience"). Briefly, and according to this particular embodiment, a USB-C dock (or a USB-C breakout hub), through TOT (Internet of Things) enables the integrated desktop experience to interface with and operably control the peripheral devices. This interface may also be configured to enable powering and recharging to the EUD 14. The USB-C dock may be accessibly mounted one compartment or otherwise mounted on an underneath side of the insert 74.

The user may then utilize the peripheral devices, such as the mouse 78 and the keyboard 108, to interface with the EUD 14 and the monitor 116. If there is no power source available, the system 10 may be used with full functionality until an internal power source (such as a UPS power source) is depleted, including recharging of the EUD 14.

In a commercial or non-military setting, other embodiments of the system that are not necessarily illustrated herein may be used as a mobile desktop. Such embodiments may be carried on to commercial airlines and other areas in which use of a conventional laptop may not be appropriate. Such systems may be useful for working on presentations or web-based researching in an easy and familiar desktop computing setup with a suitable end user device. Another benefit to such embodiments would be that the system utilizes the computing power and network of the end user device, which is commonplace and would not require additional, costly electronics.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A field-operable tactical operations management system comprising: a case having a rigid base and a rigid lid pivotally coupled to the rigid base; and a field interface within the case and comprising: a power management system configured to store energy, to power the field interface, or both; a plurality of compartments, each compartment of the plurality configured to receive a peripheral device; a user input device; and a display operably coupled to the rigid lid, wherein the field interface is configured to be operably coupled to an end user device such that the end user device may be operated by way of the field interface with the user input device and the plurality of compartments is formed from walls of an insert and the walls of the insert are modular; and a cover configured to cover at least one compartment of the plurality; and the user input device is a keyboard located adjacent to the cover and further configured to cover at least one compartment of the plurality and to be removable from the case; and a data hub configured to removably receive in at least one compartment and couple the user input peripheral devices to the field interface.

2. The field-operable tactical operations management system of claim 1, wherein the user input device is a mouse, a keyboard, a microphone, a touchscreen, or a combination thereof.

3. The field-operable tactical operations management system of claim 1, further comprising: a cover configured to cover at least one compartment of the plurality and to receive the end user device.

4. The field-operable tactical operations management system of claim 1, wherein the cover is further configured to receive the end user device.

5. The field-operable tactical operations management system of claim 1, wherein the case further comprises a position lock to secure a relative position of the rigid base and the rigid lid.

6. The field-operable tactical operations management system of claim 1, wherein the insert is constructed from a molded material, an extruded material, foam, or from an additive manufacturing material.

7. The field-operable tactical operations management system of claim 1, wherein the field interface is operably coupled to the end user device by an integrated desktop experience.

8. A field-operable tactical operations management supersystem comprising: a case having a rigid base and a rigid lid pivotally coupled to the rigid base; a field interface within the case and comprising: a power management system configured to store energy, to power the field interface, or both; a plurality of compartments, each compartment of the plurality configured to receive a peripheral device; a user input device; and a display operably coupled to the rigid lid; and a computing system, wherein the computing system is configured to interface with the field interface such that the computing system may be operated by way of the field interface with the user input device and the plurality of compartments is formed from walls of an insert and the walls of the insert are modular; and a cover configured to cover at least one compartment of the plurality; and the user input device is a keyboard located adjacent to the cover and further configured to cover at least one compartment of the plurality and to be removable from the case; and a data hub configured to removably receive in at least one compartment and couple the user input peripheral devices to the field interface.

9. A field-operable tactical operations management supersystem of claim 8, wherein the computing system is an end user device.

10. The field-operable tactical operations management supersystem of claim 9, wherein the end user device includes an integrated desktop experience.

11. The field-operable tactical operations management supersystem of claim 9, wherein the end user device includes a smart phone, a tablet, or a laptop.

12. The field-operable tactical operations management supersystem of claim 8, wherein the user input device is a mouse, a keyboard, a microphone, a touchscreen, or a combination thereof.

13. The field-operable tactical operations management supersystem of claim 8, wherein the insert is constructed from a molded material, an extruded material, foam, or from an additive manufacturing material.

* * * * *